(12) United States Patent
Xiong et al.

(10) Patent No.: US 10,461,493 B2
(45) Date of Patent: Oct. 29, 2019

(54) WAVELENGTH LOCKER USING MULTIPLE FEEDBACK CURVES TO WAVELENGTH LOCK A BEAM

(71) Applicant: Lumentum Operations LLC, Milpitas, CA (US)

(72) Inventors: Wei Xiong, Shenzhen (CN); Michael C. Larson, Oakland, CA (US); Paul Colbourne, Ottawa (CA); Sheldon McLaughlin, Ottawa (CA)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/100,769

(22) Filed: Aug. 10, 2018

(65) Prior Publication Data

US 2019/0006816 A1    Jan. 3, 2019

Related U.S. Application Data

(63) Continuation of application No. 15/132,797, filed on Apr. 19, 2016, now Pat. No. 10,050,405.

(51) Int. Cl.
*H01S 3/10*    (2006.01)
*H01S 3/00*    (2006.01)
(Continued)

(52) U.S. Cl.
CPC ......... *H01S 3/1305* (2013.01); *H01S 3/0811* (2013.01); *H01S 3/08027* (2013.01);
(Continued)

(58) Field of Classification Search
CPC .. H01S 3/1305; H01S 3/08036; H01S 5/0687; H01S 5/141; H01S 3/0811;
(Continued)

(56) References Cited

U.S. PATENT DOCUMENTS 5,128,798 A * 7/1992 Bowen ................... G02B 5/284
                                                                356/519
5,798,859 A     8/1998 Colbourne
(Continued)

FOREIGN PATENT DOCUMENTS

WO    WO2011/023765    3/2011

OTHER PUBLICATIONS

P. Wang et al., "Passive photonic integrated ratiometric wavelength monitor with resolution better than 15pm", Optics Express vol. 25, Feb. 3, 2017, 11 pages.

*Primary Examiner* — Yuanda Zhang
(74) *Attorney, Agent, or Firm* — Harrity & Harrity, LLP

(57) ABSTRACT

A device may include a first photodetector to generate a first current based on an optical power of an optical beam. The device may include a beam splitter to split a portion of the optical beam into a first beam and a second beam. The device may include a wavelength filter to filter the first beam and the second beam. The wavelength filter may filter the second beam differently than the first beam based on a difference between an optical path length of the first beam and an optical path length of the second beam through the wavelength filter. The device may include second and third photodetectors to respectively receive, after the wavelength filter, the first beam and the second beam and to generate respective second currents.

20 Claims, 7 Drawing Sheets

(51) Int. Cl.
  *H01S 3/13*    (2006.01)
  *H01S 5/0687*  (2006.01)
  *H01S 3/08*    (2006.01)
  *H01S 3/081*   (2006.01)
  *H01S 3/106*   (2006.01)
  *H01S 5/14*    (2006.01)
  *H01S 5/00*    (2006.01)

(52) U.S. Cl.
  CPC ...... *H01S 3/08036* (2013.01); *H01S 3/10061* (2013.01); *H01S 3/1062* (2013.01); *H01S 5/0687* (2013.01); *H01S 5/141* (2013.01); *H01S 3/005* (2013.01); *H01S 3/1303* (2013.01); *H01S 5/005* (2013.01)

(58) Field of Classification Search
  CPC ............... H01S 3/10061; H01S 3/1062; H01S 3/08027; H01S 3/1303; H01S 3/005; H01S 5/005
  See application file for complete search history.

(56) References Cited

U.S. PATENT DOCUMENTS

| | | |
|---|---|---|
| 6,178,002 B1 | 1/2001 | Mueller-Wrts |
| 6,366,592 B1 | 4/2002 | Flanders |
| 6,526,071 B1 | 2/2003 | Zorabedian et al. |
| 6,549,548 B2 | 4/2003 | Kuznetsov et al. |
| 6,560,252 B1 | 5/2003 | Colbourne |
| 6,714,566 B1 | 3/2004 | Coldren et al. |
| 6,782,017 B1* | 8/2004 | Kai ........................ H01S 5/0687 359/247 |
| 6,822,979 B2 | 11/2004 | Daiber |
| 7,095,776 B2 | 8/2006 | Kuznetsov et al. |
| 7,120,176 B2 | 10/2006 | McDonald et al. |
| 7,397,571 B2 | 7/2008 | Krneta et al. |
| 7,420,686 B2 | 9/2008 | Tan |
| 7,573,919 B2 | 8/2009 | Cattelan et al. |
| 7,633,624 B1 | 12/2009 | Wickholm |
| 8,179,930 B2 | 5/2012 | Musio et al. |
| 8,254,418 B2 | 8/2012 | Smith et al. |
| 8,311,067 B2 | 11/2012 | Ensher et al. |
| 9,395,504 B2 | 7/2016 | Uesaka et al. |
| 10,050,405 B2 | 8/2018 | Xiong et al. |
| 2003/0072542 A1 | 4/2003 | Furuichi |
| 2003/0133480 A1* | 7/2003 | Torazawa ............... H01S 5/0687 372/36 |
| 2005/0018995 A1 | 1/2005 | Chang |
| 2011/0032529 A1 | 2/2011 | Wan et al. |
| 2011/0052207 A1 | 3/2011 | Ishikawa |
| 2012/0025714 A1 | 2/2012 | Downing, Jr. et al. |
| 2015/0076990 A1* | 3/2015 | Uesaka ................ G02B 6/4215 315/151 |
| 2015/0155679 A1* | 6/2015 | Miyata .................... H01S 3/106 372/20 |
| 2015/0318951 A1 | 11/2015 | Zhang |
| 2016/0336718 A1 | 11/2016 | Takabayashi et al. |
| 2017/0302052 A1 | 10/2017 | Xiong et al. |
| 2017/0353001 A1 | 12/2017 | Takabayashi |
| 2019/0044300 A1 | 2/2019 | Takabayashi et al. |

\* cited by examiner

WAVELENGTH LOCKER USING MULTIPLE FEEDBACK CURVES TO WAVELENGTH LOCK A BEAM

RELATED APPLICATION

This application is a continuation of U.S. patent application Ser. No. 15/132,797, filed Apr. 19, 2016 (now U.S. Pat. No. 10,050,405), the disclosure of which is incorporated herein by reference.

TECHNICAL FIELD

The present disclosure relates to laser systems and methods of operating laser systems. More particularly, the present disclosure relates to methods and systems for performing wavelength locking of a laser emitter.

BACKGROUND

An optical device, such as a transmitter optical subassembly (TOSA), a transmitter/receiver optical subassembly (TROSA), or the like, may convert electrical signals into optical signals to transmit information to another device, such as a receiver optical subassembly (ROSA), another TROSA, or the like. In some cases, the optical signals are generated based on laser beams having particular target wavelengths/frequencies. For example, in a dense wavelength division multiplexing (DWDM) application, the optical signals may be generated to conform to frequencies identified by the International Telecommunication Union (ITU) ITU-C DWDM G.694.1 grid specification. By generating the optical signals at particular frequencies, the optical device simplifies multiplexing and demultiplexing of the optical signals and reduces interference and crosstalk between optical signals with similar wavelengths.

SUMMARY

According to some possible implementations, a device may include a laser emitter to generate a laser beam to be wavelength locked to a target frequency based on an emission frequency to be measured by the device. The device may include a first photodetector to generate a first current based on a first optical power of the laser beam. The laser beam may be wavelength locked based on the first current. The device may include a beam splitter to split a portion of the laser beam into a first beam and a second beam. The device may include an etalon to filter the first beam and the second beam based on the emission frequency of the laser beam. The etalon may have different optical path lengths for the first beam and the second beam. The etalon may filter the first beam and the second beam to a second optical power and a third optical power, respectively, based on the respective optical path lengths in the etalon. The device may include second and third photodetectors to generate respective second currents. A selected current, of the second currents, may be used to wavelength lock the laser beam. The selected current may be selected based on which of the second currents will provide a more accurate measurement of the emission frequency. The second and third photodetectors may generate the respective second currents based on the second optical power and the third optical power, respectively.

According to some possible implementations, a device may include a first photodetector to generate a first current based on an optical power of an optical beam. The device may include a beam splitter to split a portion of the optical beam into a first beam and a second beam. The device may include a wavelength filter to filter the first beam and the second beam. The wavelength filter may filter the second beam differently than the first beam based on a difference between an optical path length of the first beam and an optical path length of the second beam through the wavelength filter. The device may include second and third photodetectors to respectively receive, after the wavelength filter, the first beam and the second beam and to generate respective second currents.

According to some possible implementations, a method may include receiving or generating, by an optical device, a laser beam to be wavelength locked to a target frequency based on an emission frequency at which the laser beam is generated. The method may include determining, by the optical device, a reference value based on an optical power of the laser beam. The method may include dividing, by the optical device, the laser beam into a first beam and a second beam. The method may include wavelength filtering, by the optical device, the first beam and the second beam using different optical path lengths in a wavelength filter. The different optical path lengths may cause the wavelength filter to filter the first beam differently than the second beam. The method may include determining, by the optical device, respective transmission values corresponding to the first beam and the second beam. The method may include selecting, by the optical device and as a selected transmission value, one of the transmission values. The selected transmission value may be selected based on which of the transmission values will provide a more accurate measurement of the emission frequency. The method may include determining, by the optical device, the emission frequency based on the selected transmission value and the reference value. The method may include controlling, by the optical device, the emission frequency of the laser beam based on a difference between the emission frequency and the target frequency.

DETAILED DESCRIPTION

Figure 1A:
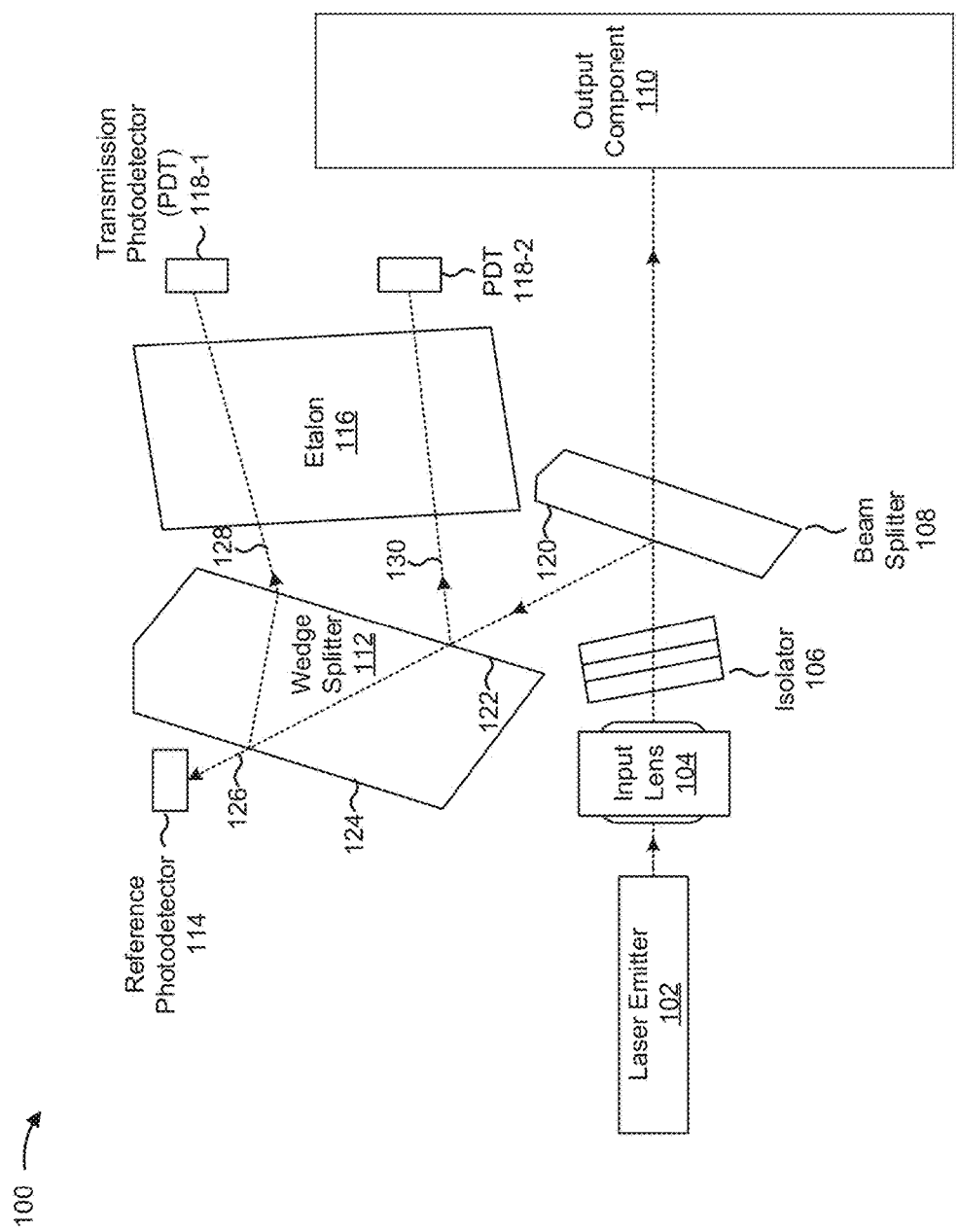
FIGS. 1A-1D are diagrams of example implementations of a wavelength locker that uses multiple feedback curves.

The following detailed description refers to the accompanying drawings. The same reference numbers in different drawings may identify the same or similar element.

An optical subassembly, such as a TOSA, a TROSA, or the like, generates laser beams to encode or modulate and transmit information via optical connections using optical channels. The optical subassembly may include a laser emitter, such as a laser chip, a tunable laser diode, or the like, to generate the laser beams. The laser emitter may emit laser beams at particular target wavelengths, which simplifies processing of the laser beams and reduces interference between neighboring optical channels. In some cases, the target wavelengths may be selected based on a grid, such as the ITU-C DWDM grid, and may therefore be evenly spaced in the optical spectrum and may be known when designing a wavelength locker for the optical subassembly. In other cases, the target wavelengths may be selected arbitrarily (e.g., not based on a grid), and may or may not be evenly spaced in the optical spectrum and may or may not be known when designing a wavelength locker for the optical subassembly. For example, tunable frequency laser emitters, tunable TOSAs, tunable TROSAs, and the like allow the target frequency of a laser to be tuned within a range of frequencies. Accordingly, the target frequencies may not be known when designing the wavelength locker. In practice, the laser beam emitted by the laser emitter, whether tunable or not, will sometimes deviate from a target wavelength based on manufacturing tolerances, temperature and humidity fluctuations, improper calibration, damage, or the like.

The optical subassembly may use a wavelength locker to wavelength lock the emitted laser beam based on the target wavelength. Wavelength locking is a process by which the frequency of the emitted laser beam is adjusted to match or approximately match the target wavelength. A wavelength locker may include a wavelength filter, such as an etalon, an interferometer, Fabry-Perot etalon, a Michelson interferometer, or other structure that wavelength filters the emitted laser beam to a narrow range of frequencies. A Fabry-Perot etalon includes two substantially parallel, partially reflective surfaces that create a multibeam interference effect in a laser beam that causes the laser beam to be filtered based on a wavelength of the laser beam. The relationship between the filtered optical power of the laser beam and the wavelength of the laser beam may be approximated by a periodic function, such as the periodic Airy function.

An etalon may have different wavelength-filtering effects depending on the optical path of light through the etalon. Whether a wavelength of light on that path will be transmitted at high energy or at low energy depends on the wavelength ($\lambda$) of the light (in vacuum), the angle the light travels through the etalon ($\theta$), the thickness of the etalon (l) and the refractive index of the material between the reflecting surfaces (n). As used herein, "optical path" may include the geometric path to be traversed by an optical beam and/or the effect of the refractive index of the material which the optical beam is to traverse.

Figure 3A:
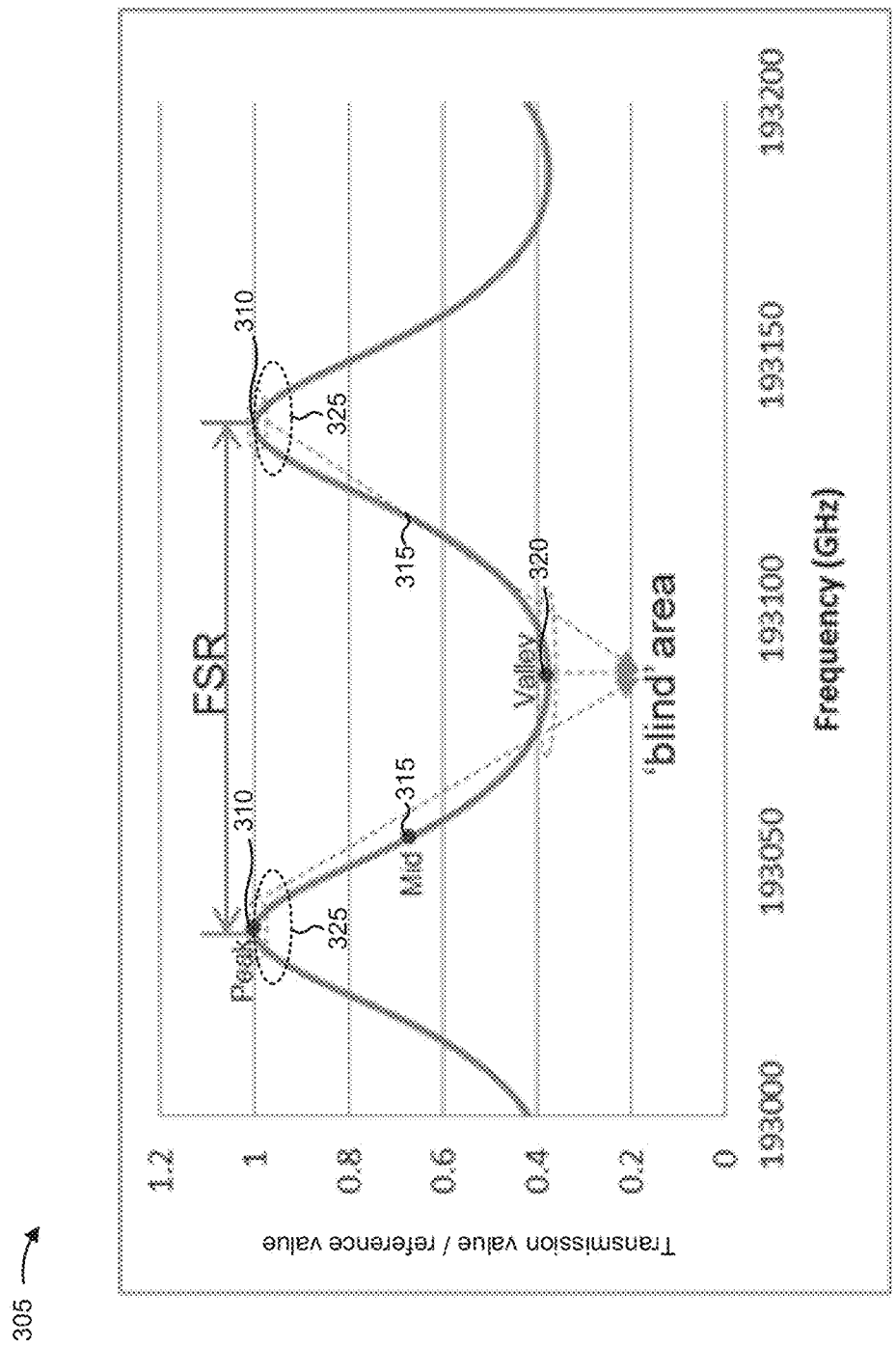
FIG. 3A is a graph of an example relationship between transmission values and reference values describing a laser beam and wavelength of the laser beam, as generated by a wavelength locker using a single feedback curve.

Referring briefly to FIG. 3A, a feedback curve is charted which is based on a ratio of an optical power of the laser beam before filtration (i.e., a reference value) to an optical power of the laser beam after filtration (i.e., a transmission value). The wavelength locker may estimate an observed wavelength (i.e., an emission frequency) of the laser beam using the feedback curve. Based on a difference between the observed wavelength and the target wavelength, the wavelength locker may generate a feedback signal to control the wavelength of the laser beam as generated. The relationship between the filtered optical power of the laser beam and the wavelength of the laser beam may be approximated by a periodic function, such as the periodic Airy function, the wrapped Lorentzian distribution, the wrapped Cauchy distribution, or the like.

As can be seen in FIG. 3A, some ratios of filtered optical power to unfiltered optical power may be more accurate than other ratios with regard to measuring an observed wavelength of a laser beam. For example, the calculation used to determine the emission frequency may include uncertainty. Therefore, a ratio that is located at a point in the feedback curve with a steep slope (e.g. Mid 315 in FIG. 3A) may give a more accurate estimate of wavelength (e.g. emission frequency) than a ratio that is located at a point in the feedback curve with a shallow slope (e.g.s, Peak 325 or 'blind' area or Valley 320), based on a range of uncertainty at the steep slope encompassing less bandwidth than an equivalent range of uncertainty at the shallow slope.

To reduce the uncertainty in the wavelength estimation, a party may design the wavelength filter such that steep slopes of the feedback curve are associated with frequencies/wavelengths at which the wavelength locker will lock laser beams while shallow slopes of the feedback curve are avoided. This design work may be straightforward to align evenly-spaced target wavelengths with steep-sloped areas of the periodic feedback curve. However, changing the target wavelengths in use (even for grid-fixed frequencies, such as when switching grid spacing from 50 GHz to 25 GHz), or using the wavelength locker with configurable wavelengths or tunable laser emitters, may cause the target wavelengths to align with the shallow sloped areas of the feedback curve (e.g., a "blind spot," as will be described with regard to FIG. 3A). As above, this association reduces accuracy and precision of corresponding measurements of the wavelength of the laser beams.

Implementations described herein describe a wavelength locker that uses multiple feedback curves to determine wavelength of a laser beam. The multiple feedback curves may be shifted, as will be described with regard to FIG. 3B. The shift between the respective feedback curves may be selected so that any wavelength that can be outputted by the laser emitter is associated with a steep portion of one or more of the feedback curves. As one example, a first feedback curve may have the same period as, but be shifted in frequency relative to, a second feedback curve by approximately 15 percent to 35 percent of a period of the first and second feedback curves. More than two feedback curves having the same period, but being frequency shifted relative to each other, may be provided.

When the wavelength is associated with a steep portion of a feedback curve, an estimate of the value of the wavelength is more accurate and/or precise than when the wavelength is associated with a shallow portion of the feedback curve. The wavelength locker, or a controller associated with the wavelength locker, may select, from the multiple feedback curves, a feedback curve that is likely to give a best wavelength estimate for the laser beam and its target wavelength.

In this way, the wavelength locker improves accuracy and precision of wavelength locking and simplifies wavelength measurement of target wavelengths that are not evenly spaced. Furthermore, the wavelength locker can be used for different wavelengths of laser beams, such as tunable laser beams, and in some cases for laser beams with varying optical paths through the wavelength filter, without reconfiguration or replacement of the wavelength filter, which saves time and cost of implementing the wavelength locker.

As used herein, references to wavelengths of laser beams are examples, and can be replaced with references to frequencies of laser beams, in some implementations.

FIGS. 1A-1D are diagrams of example implementations of a wavelength locker 100 that uses multiple feedback curves to wavelength lock a laser beam. As shown in FIG. 1A, in some implementations, wavelength locker 100 includes a laser emitter 102, an input lens 104, an isolator 106, a beam splitter 108, an output component 110, a wedge splitter 112, a reference photodetector 114, an etalon 116, and transmission photodetectors 118-1 and 118-2 (shown in FIGS. 1A-1D as "PDT"). In some implementations, wavelength locker 100 may include a controller (e.g., controller 164), which is described in more detail in connection with FIG. 1D.

Laser emitter 102 includes one or more devices that emit a laser beam. In some implementations, laser emitter 102 includes tunable laser emitters that are one or more devices that emit a laser beam having a configurable emission frequency. For example, laser emitter 102 includes a solid-state laser, a gas laser, a fiber laser, a semiconductor laser diode, a semiconductor laser chip, or the like, that emits a laser beam to input lens 104 and isolator 106. In some implementations, laser emitter 102 may include an emitter that emits an optical signal, such as an optical beam, which may or may not be a laser beam. Input lens 104 includes a cylinder lens, a spherical lens, an aspheric lens, or the like, that collimates a laser beam. Isolator 106 includes an optical isolator, such as a Faraday isolator, or the like, to reduce back-reflection of laser light from components of wavelength locker 100 to laser emitter 102.

Isolator 106 may polarize a laser beam to a particular polarization state (e.g., 45 degrees rotated from an original polarization state of the laser beam) based on the Faraday effect. In some implementations, isolator 106 may be located in between laser emitter 102 and input lens 104. In some implementations, wavelength locker 100 may not include isolator 106.

As further shown, isolator 106 may transmit the laser beam to beam splitter 108. Beam splitter 108 includes a device that can split a laser beam to form two or more laser beams. For example, beam splitter 108 includes a partially reflecting mirror (e.g., a dielectric mirror or a dichroic mirror), a beam splitter cube (e.g., a glass cube or a crystalline cube), a fiber-optic beam splitter, or the like. In some implementations, surface 120 of beam splitter 108 may be coated with a partially reflective coating.

As shown, beam splitter 108 directs a portion of the laser beam to output component 110 by passing through the beam splitter 108, and directs, by reflection, another portion of the laser beam to wedge splitter 112. Output component 110 includes one or more components that receive a laser beam and/or modify a laser beam for output by wavelength locker 100. For example, output component 110 may include an output lens (e.g., a spherical lens, an aspheric lens, a cylinder lens, etc.) that focuses, shifts, collimates, or de-collimates a laser beam, a polarization-maintaining pigtail connected with an optical fiber to which a laser beam is transmitted, an amplifier, or the like.

In some implementations, beam splitter 108 may pass 80%, 90%, 95%, 97%, 99%, or the like, of the energy of the laser beam to output component 110. In some implementations, beam splitter 108 may reflect a portion of the laser beam to output component 110, and may pass a portion of the laser beam to wedge splitter 112 (e.g., depending on the configuration of components of wavelength locker 100).

Wedge splitter 112 includes a substrate (e.g., a glass substrate, a crystal substrate, etc.) with surface coatings 122 and 124. Surface coatings 122 and 124 include partially reflective surface coatings. In some implementations, surface coatings 122 and 124 are configured to cause laser beams 126, 128, and 130 to have approximately equal optical powers before filtration by etalon 116, which simplifies generation of feedback signals based on measurements of optical powers of laser beams 126, 128, and/or 130.

In some implementations, the surfaces corresponding to surface coatings 122 and 124 may not be parallel. For example, the surfaces may be set at a relative angle (e.g., 1/6 degree, 1 degree, 5 degrees, or a higher or lower value) to cause laser beams 128 and 130 to have an angular separation.

As shown, wedge splitter 112 may pass laser beam 126 to reference photodetector 114. Reference photodetector 114 includes a photodetector, such as a photodiode, a light sensor, or the like, that generates a reference current proportional to an optical power of laser beam 126. In some cases, reference photodetector 114 may be connected to laser emitter 102 and may provide the reference current to laser emitter 102 for use by laser emitter 102 to regulate frequency of the emitted laser beam. Additionally, or alternatively, a controller included in wavelength locker 100 (e.g., controller 164) may receive the reference current and may regulate the frequency of the laser beam emitted by laser emitter 102, as described in more detail with reference to FIG. 1D, below.

As further shown, wedge splitter 112 reflects laser beams 128 and 130 to etalon 116. As shown, laser beams 128 and 130 may have an angular separation. Etalon 116 includes an interferometer (e.g., a Michelson interferometer, a Fabry-Perot interferometer, or a Fabry-Perot etalon) that wavelength filters laser beams that enter etalon 116. The optical power of an output transmission of etalon 116 varies periodically with regard to the frequency of an input to etalon 116, and with regard to an optical path length, within etalon 116, of the input laser beam. The relationship between the optical power of the output transmission, the frequency of the input, and the optical path length is referred to herein as a feedback curve.

As used herein, an optical path length refers to the product of the geometric length of the optical path that a laser beam follows through a component and the index of refraction of the component with regard to the laser beam. For example, a laser beam with a larger incident angle to etalon 116 travels farther in etalon 116 than a laser beam with a smaller incident angle, and therefore has a different optical path length. The difference between two optical path lengths is referred to as an optical path difference.

Varying optical paths through etalon 116 may be associated with different feedback curves. That is, based on the optical path through etalon 116 traversed by a laser beam, and based on the optical properties of the laser beam, etalon 116 may filter the laser beam according to different feedback curves. For example, a feedback curve for laser beams with a greater optical path length through the etalon 116 may be shifted in frequency in relation to a feedback curve for laser beams with a lesser optical path length, and the shift may be proportional to the optical path difference between the greater optical path length and the lesser optical path length. As another example, when etalon 116 includes a birefringent material (as in FIG. 1C), optical path length may differ based on the optical properties of laser beams that traverse a particular optical path (i.e., optical path length may decrease for laser beams with a lower refractive index in the birefringent material relative to laser beams with a higher refractive index).

The optical path difference between two optical paths through etalon 116 may be designed to cause a particular shift (i.e., peak offset, as described in more detail below) between the feedback curves. The particular shift may be designed to cause the entirety of a range of potential wavelength values of the laser beams emitted by laser emitter 102 to be covered by one or more steep portions of the feedback curves. A more detailed description of the relationship between feedback curves and optical path length is provided with reference to FIGS. 2 and 3B, below.

The optical path, and therefore the optical path difference, of laser beams in FIG. 1A varies based on the relative angle at which the laser beams are transmitted to etalon 116 and the angle at which etalon 116 is fixed to an optical bench or substrate. By manipulating the optical paths (and optical path difference) that laser beams 128 and 130 traverse in etalon 116, wavelength locker 100 shifts the feedback curve describing an output optical power of laser beam 128 relative to the feedback curve describing an output optical power of laser beam 130. As one possible example, the feedback curves may have an equal period, and the feedback curve corresponding to laser beam 130 may be shifted by approximately 15 percent to 35 percent of the period, relative to the feedback curve corresponding to laser beam 128. This shift is referred to herein as a peak offset. For a graphical representation and description of this relationship, see FIG. 3B.

As shown, transmission photodetector 118-1 receives filtered laser beam 128. Transmission photodetector 118-1 generates a first transmission current based on an optical power of filtered laser beam 128. As further shown, transmission photodetector 118-2 receives laser beam 130. Transmission photodetector 118-2 generates a second transmission current based on the optical power of laser beam 130. In some implementations, transmission photodetectors 118-1 and 118-2 may provide the transmission currents to laser emitter 102 and/or a controller associated with wavelength locker 100 (e.g., controller 164).

Based on the transmission currents generated by transmission photodetectors 118-1 and 118-2 and the reference current generated by reference photodetector 114, wavelength locker 100 controls a frequency of the laser beam outputted by wavelength locker 100. A more detailed description of the operations performed to control the frequency of the laser beams will be provided in reference to FIGS. 1D, 2, and 3B, below.

Figure 1B:
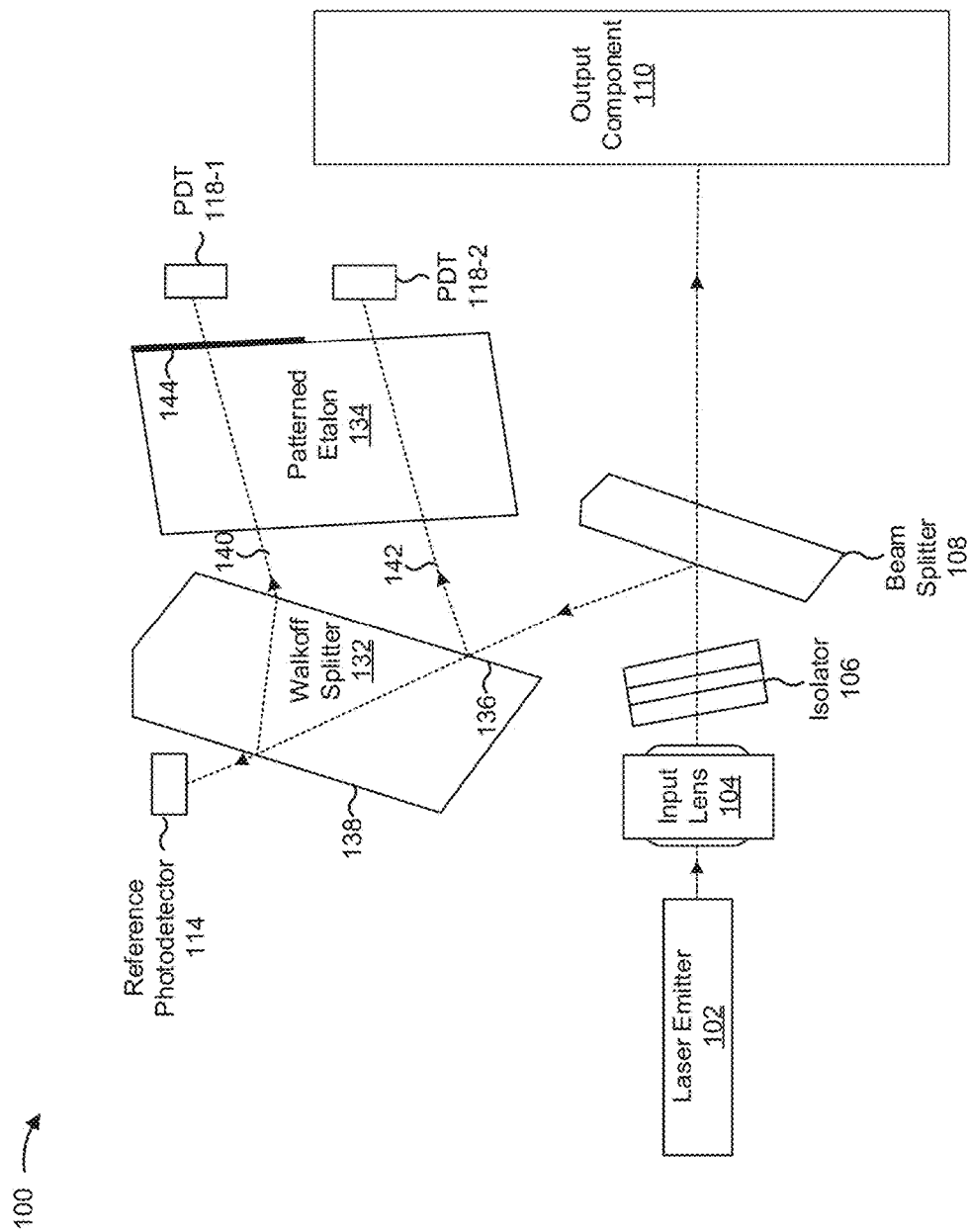

FIG. 1B shows an example implementation of wavelength locker 100 that includes a walkoff splitter 132 and a patterned etalon 134. Walkoff splitter 132 includes a crystal component, a glass component, or the like, that partially passes and partially reflects laser beams. Walkoff splitter 132 causes a particular spatial separation between optical paths that laser beams 140 and 142 are to traverse in patterned etalon 134. The particular spatial separation may cause the optical path of one of laser beam 140 and 142 to pass through patterned surface 144 of patterned etalon 134 while the optical path of the other of laser beam 140 and 142 does not pass through patterned surface 144.

In some implementations, surfaces 136 and 138 of walkoff splitter 132 may be substantially parallel. Based on surfaces 136 and 138 being substantially parallel, laser beams 140 and 142 may be parallel or substantially parallel when transmitted by walkoff splitter 132 to patterned etalon 134. For example, the angular separation between surfaces 136 and 138 may be less than approximately 1/10 degree, less than approximately 1/100 degree, less than approximately 1/600 degree, or the like. In some implementations, walkoff splitter 132 may include a larger distance between surfaces 136 and 138 than the surfaces of wedge splitter 112 identified by reference numbers 122 and 124 in FIG. 1A.

As shown, laser beams 140 and 142 are transmitted to patterned etalon 134. Patterned etalon 134 includes a patterned surface 144 in the optical path of laser beam 140 or laser beam 142. Patterned surface 144 may include a patterned surface, an etched surface, a coated surface, a wafer attached to patterned etalon 134, or the like. Patterned surface 144 modifies an optical path length of a laser beam that is transmitted on an optical path through patterned surface 144 (e.g., laser beam 140) as compared to an optical path length for a laser beam that is transmitted on an optical path through patterned etalon 134 and not patterned surface 144 (e.g., laser beam 142). Therefore, patterned surface 144 causes an optical path difference between optical paths corresponding to laser beam 140 and laser beam 142. As one possible example, for feedback curves with a period of 50 GHz, patterned surface 144 may include a fused silica step with a thickness of approximately 140 nm or in a range of approximately 125 to 155 nm, and the optical path difference caused by the fused silica step may cause a peak offset of approximately 11.9 to 14.9 GHz between the feedback curves corresponding to laser beams 140 and 142. As another example, the peak offset between feedback curves with a period of X may be in the range of X/4+/−X/10.

Patterned etalon 134 may simplify fabrication of wavelength locker 100 as compared to implementations that use an angular displacement between laser beams to introduce an optical path difference, such as the implementation shown in FIG. 1A. For example, less precise fabrication and/or less precise alignment may be used to implement patterned etalon 134 as compared to wedge splitter 112 and the corresponding etalon 116. On the other hand, etalon 116 may be less expensive than patterned etalon 134, and wedge splitter 112 may require less space in wavelength locker 100 than walkoff splitter 132.

The components of and functions performed by laser emitter 102, input lens 104, isolator 106, beam splitter 108, output component 110, reference photodetector 114, and transmission photodetectors 118-1 and 118-2, as shown in FIG. 1B, are substantially similar to those performed by the corresponding components as shown in FIG. 1A. Refer to the description of FIG. 1A, above, for a detailed description of these components and their functions.

Figure 1C:
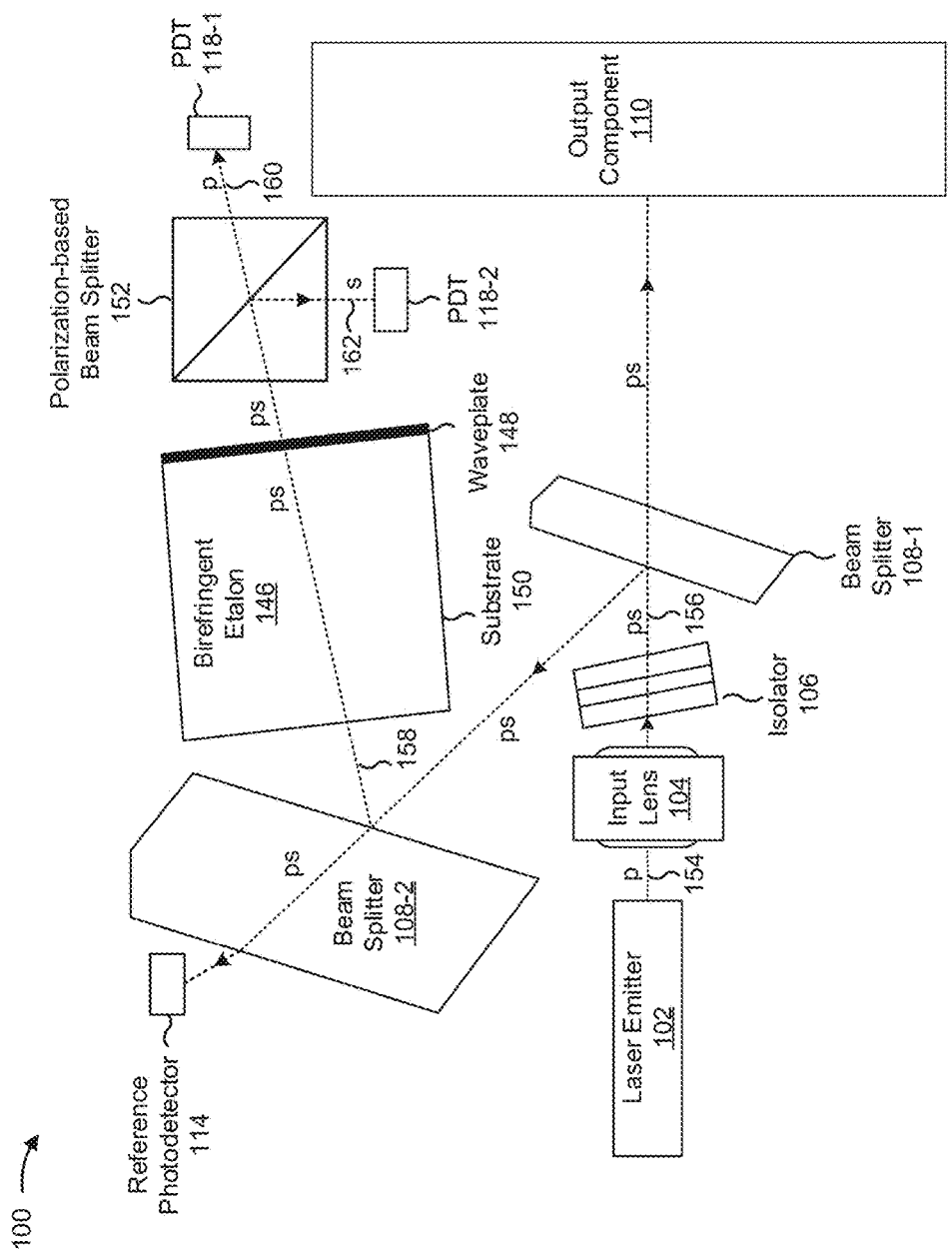

FIG. 1C shows an example implementation of a wavelength locker 100 that includes beam splitters 108-1 and 108-2, a birefringent etalon 146 (including a waveplate 148 and a substrate 150), and a polarization-based beam splitter 152. In FIG. 1C, the optical path difference between the optical paths traversed by laser beams 160 and 162 is created based on respective polarization states of laser beams 160 and 162, and based on the refractive index of birefringent etalon 146 being different for the respective polarization states of laser beams 160 and 162. In this way, laser beams 160 and 162 can traverse the same geometric optical path through birefringent etalon 146 and still experience different optical path lengths based on optical properties of laser beams 160 and 162. In effect, this may enable laser beam(s) 160/162 to traverse any arbitrary geometric optical path through birefringent etalon 146 and still be wavelength locked according to two or more shifted feedback curves.

For the purpose of FIG. 1C, laser beams with a "p" polarization state (e.g., laser beam 154 and laser beam 160) are shown in association with the letter "p," and laser beams with an "s" polarization state (e.g., a polarization state orthogonal to the "p" polarization state) are shown in association with the letter "s." Laser beams that include laser light in both a "p" polarization state and an "s" polarization state, such as the laser beam transmitted by isolator 106 at reference number 156, are shown in association with the letters "ps."

As shown in FIG. 1C, and by reference number 154, laser emitter 102 may emit laser beam 154 with a "p" polarization state. As shown by reference number 156, after laser beam 154 is transmitted by isolator 106, laser beam 154 is associated with a "p" polarization state and an "s" polarization state. For example, based on the Faraday effect, isolator 106 may rotate the polarization state of laser beam 154 45 degrees to a combination of the "p" polarization state and the "s" polarization state. As shown, a first portion of the laser beam is directed or reflected to beam splitter 108-2 and a second portion continues through or is directed to beam splitter 108-1 and is transmitted to output component 110. Output component 110 may output the second portion of the laser beam.

As further shown, the first portion of the laser beam is reflected by beam splitter 108-1 to beam splitter 108-2. Beam splitter 108-2 includes one or more of the components described with regard to beam splitter 108 in FIG. 1A. In some implementations, reflective surfaces of beam splitter 108-2 may be configured to reflect particular parts of the laser beams. For example, a back surface of beam splitter 108-2 (e.g., the surface adjacent to reference photodetector 114) may be coated with an antireflective coating to reduce reflection of the laser beam within beam splitter 108-2, which simplifies design of beam splitter 108-2. As another example, a front surface of beam splitter 108-2 (e.g., the surface that reflects laser beam 158) may be coated with a partially reflective coating that partially passes a laser beam to reference photodetector 114 (e.g., via the back surface) and partially reflects a laser beam to birefringent etalon 146.

As shown by reference number 158, at least some of a portion of the laser beam is reflected to birefringent etalon 146, which includes waveplate 148 and substrate 150. Birefringent etalon 146 is described as birefringent because waveplate 148 includes a birefringent crystal material, such as quartz or the like, that has a different refractive index for p-polarized light than for s-polarized light based on an orientation of waveplate 148, and because waveplate 148 is included in birefringent etalon 146. For example, the optical axis of waveplate 148 may be aligned to the "p" polarization state, or to the "s" polarization state, which causes waveplate 148 to have a desired difference in refractive index. By varying the refractive index for the "p" polarization state as compared to the "s" polarization state, waveplate 148 creates an optical path difference between laser beams with the "p" polarization state (e.g., laser beam 160) and laser beams with the "s" polarization state (e.g., laser beam 162).

Substrate 150 includes a non-birefringent material (e.g., a glass material) that has a refractive index equal to or similar to that of waveplate 148. For example, when waveplate 148 is a quartz crystal, substrate 150 may include a barium light flint glass substrate (e.g., N-BALF5, or the like). By selecting waveplate 148 and substrate 150 to have similar refractive indexes, interface reflection at the interface between waveplate 148 and substrate 150 is reduced, which improves performance of birefringent etalon 146.

In some implementations, one or more outer surfaces of waveplate 148 and substrate 150 (e.g., the surface of substrate 150 that laser beam 158 enters, and the outer surface of waveplate 148) may be coated with partially reflective coatings, which causes birefringent etalon 146 to wavelength filter the laser beams based on a multibeam interference effect. In other words, waveplate 148 and substrate 150, together, form birefringent etalon 146. In some implementations, waveplate 148 and substrate 150 may be arranged differently than the arrangement shown in FIG. 1C. For example, laser beam 158 may pass through waveplate 148 before substrate 150.

Birefringent etalon 146 outputs a filtered laser beam composed of p-polarized light and s-polarized light. The p-polarized light is associated with a different optical path length in birefringent etalon 146 than the s-polarized light based on respective refractive indexes of waveplate 148 with regard to the p-polarized light and the s-polarized light. Therefore, the p-polarized light and the s-polarized light are wavelength filtered based on corresponding shifted feedback curves. The shift between the feedback curves (i.e., the peak offset of the feedback curves) may be dependent on the thickness of waveplate 148 and the difference in refractive index between p-polarized light and s-polarized light, as described in more detail in connection with block 240 of FIG. 2.

Polarization-based beam splitter 152 receives the filtered laser beam, and splits the filtered laser beam into p-polarized light (e.g., laser beam 160) and s-polarized light (e.g., laser beam 162). Polarization-based beam splitter 152 includes a beam splitter that reflects, passes, or partially passes a laser beam based on a polarization state of the laser beam. For example, polarization-based beam splitter 152 may include a dichroic mirror with a different reflectivity for p-polarized light than for s-polarized light, or the like.

By wavelength filtering the laser beams before splitting the laser beams, wavelength locker 100 as shown in FIG. 1C can reduce a size of the etalon (e.g., birefringent etalon 146), which may conserve space in wavelength locker 100 as compared to a wavelength locker using etalon 116 or patterned etalon 134.

In FIG. 1C, polarization-based beam splitter 152 passes laser beam 160 and reflects laser beam 162. In some implementations, polarization-based beam splitter 152 may reflect laser beam 160 and pass laser beam 162. Additionally, or alternatively, polarization-based beam splitter 152 may split laser beams 160 and 162 before laser beams 160 and 162 are filtered by birefringent etalon 146.

The components of and functions performed by laser emitter 102, input lens 104, beam splitter 108-1, output component 110, reference photodetector 114, and transmission photodetectors 118-1 and 118-2, as shown in FIG. 1C, are substantially similar to those performed by the corresponding components as shown in FIGS. 1A and 1B. Refer to the description of FIG. 1A, above, for a detailed description of these components and their functions.

Figure 1D:
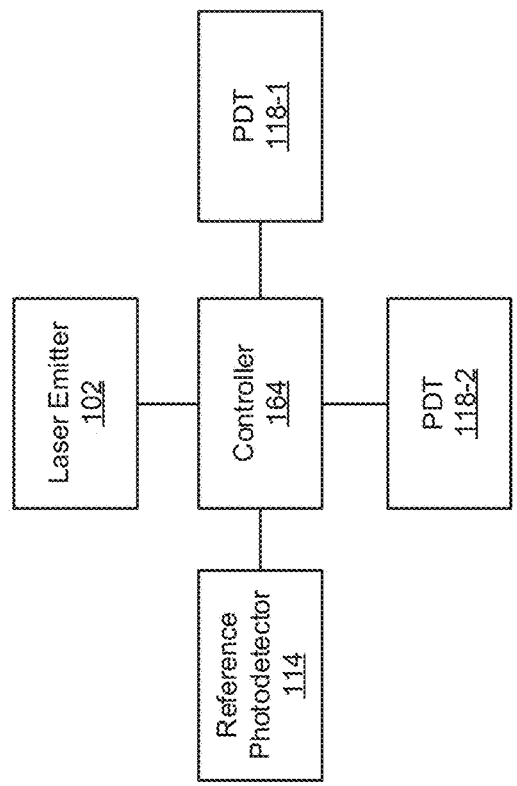

FIG. 1D is a diagram of an example implementation of a control system for wavelength locker 100. As shown in FIG. 1D, in some implementations, wavelength locker 100 may include controller 164. Controller 164 is implemented in hardware, firmware, or a combination of hardware and software. Controller 164 may include a processor, such as a digital signal processor, a microprocessor, an integrated circuit (e.g., a photonic integrated circuit, an application-specific integrated circuit, etc.), a field-programmable gate array, or the like. Controller 164 may also include other components that interact with the processor, such as a memory device, a communication interface, an input component, and/or an output component. The memory device may store instructions or data used by the processor. The communication interface may permit the processor to communicate with other components of the laser system, to receive commands from external to the laser system, and/or to provide data external to the laser system. Controller 164 may include computer-readable instructions stored in a non-transitory computer readable medium for execution by a general purpose computer, reconfigurable hardware (such as FPGAs), application-specific hardware (such as ASICs), and/or combinations of these implementation technologies.

As shown, controller 164 may be connected with reference photodetector 114, transmission photodetectors 118-1 and 118-2, and laser emitter 102. Controller 164 may receive the transmission currents generated by transmission photodetectors 118-1 and 118-2 and the reference current generated by reference photodetector 114. Controller 164 may receive and/or store a reference wavelength corresponding to a beam emitted by laser emitter 102. The reference wavelength may identify a target wavelength based on which the beam is to be wavelength locked.

Controller 164 may select a transmission current, of the transmission currents, based on the reference wavelength. For example, controller 164 may select the transmission current corresponding to the feedback curve having the steepest slope at the reference wavelength. As another example, controller 164 may store information identifying first ranges of wavelengths in which to select a first feedback curve, and second ranges of wavelengths in which to select a second feedback curve. Controller 164 may determine whether the reference wavelength is in one of the first ranges or one of the second ranges, and may select a transmission current corresponding to the first feedback curve or the second feedback curve accordingly.

Controller 164 may determine an observed frequency of the beam based on determining (e.g., looking up, computing, etc.) the ratio of the selected transmission value and the reference value and using the selected feedback curve. For example, for a given feedback curve, controller 164 may store information correlating particular ratios with corresponding observed frequencies, and controller 164 may use the stored information to determine an observed frequency of the beam based on the ratio. Controller 164 may generate a feedback signal to control the wavelength of the beam based on a difference between the observed frequency and the reference frequency. Controller 164 may cause laser emitter 102 to modify the frequency of the beam to cause the observed frequency to approximately match or approach the reference frequency (e.g., by modifying a tuning current that is provided to laser emitter 102).

In this way, wavelength locker 100 uses multiple feedback curves corresponding to different optical paths through a wavelength filter and/or different treatment of optical beams in the wavelength filter based on optical properties of the optical beams to wavelength lock a laser beam. This improves accuracy and precision of the wavelength locking process and permits more accurate wavelength locking of a wider variety of laser beam frequencies (e.g., frequencies on different grids) than a single feedback curve. Furthermore, wavelength locker 100 can be implemented in connection with a tunable laser emitter without reconfiguration or replacement of etalon 116/134/146 to match changing wavelengths of laser beams emitted by the tunable laser emitter.

As indicated above, FIGS. 1A-1D are provided merely as examples. Other examples are possible and may differ from what was described with regard to FIGS. 1A-1D. For example, wavelength locker 100 may include additional components, fewer components, different components, or differently-arranged components than those shown in FIGS. 1A-1D. As another example, wavelength locker 100 may cause an optical path difference between two beams using one of, or any combination of two or more of, an angular separation between optical paths traversed by the two beams (e.g., as in FIG. 1A), a physical length difference between two portions of an etalon (e.g., as in FIG. 1B), a difference in refractive index with regard to the two beams (e.g., as in FIG. 1C), or a similar method. That is, wavelength locker 100 may cause the optical path difference by varying one or more of the respective optical paths to be followed by the two beams in the etalon, or the treatment of the two beams by the etalon based on optical properties of the two beams. Other ways to vary the optical path difference between multiple beams in an etalon are also contemplated, for example, providing separate etalon structures for each beam.

By creating an optical path difference between two optical paths through the etalon, wavelength locker 100 causes a feedback curve associated with one optical path through the etalon to be shifted in frequency with regard to a feedback curve for a second of the two optical paths through the etalon. In some implementations, the optical path difference may be configured to cause a particular peak offset between the feedback curves. For example, the feedback curves may have a substantially equal period, and the particular peak offset may be between 15 percent and 35 percent of the period. As another example, the particular peak offset may be selected such that any frequency that can be emitted by laser emitter 102 is associated with at least one steeply-sloped region of one of the feedback curves.

Figure 2:
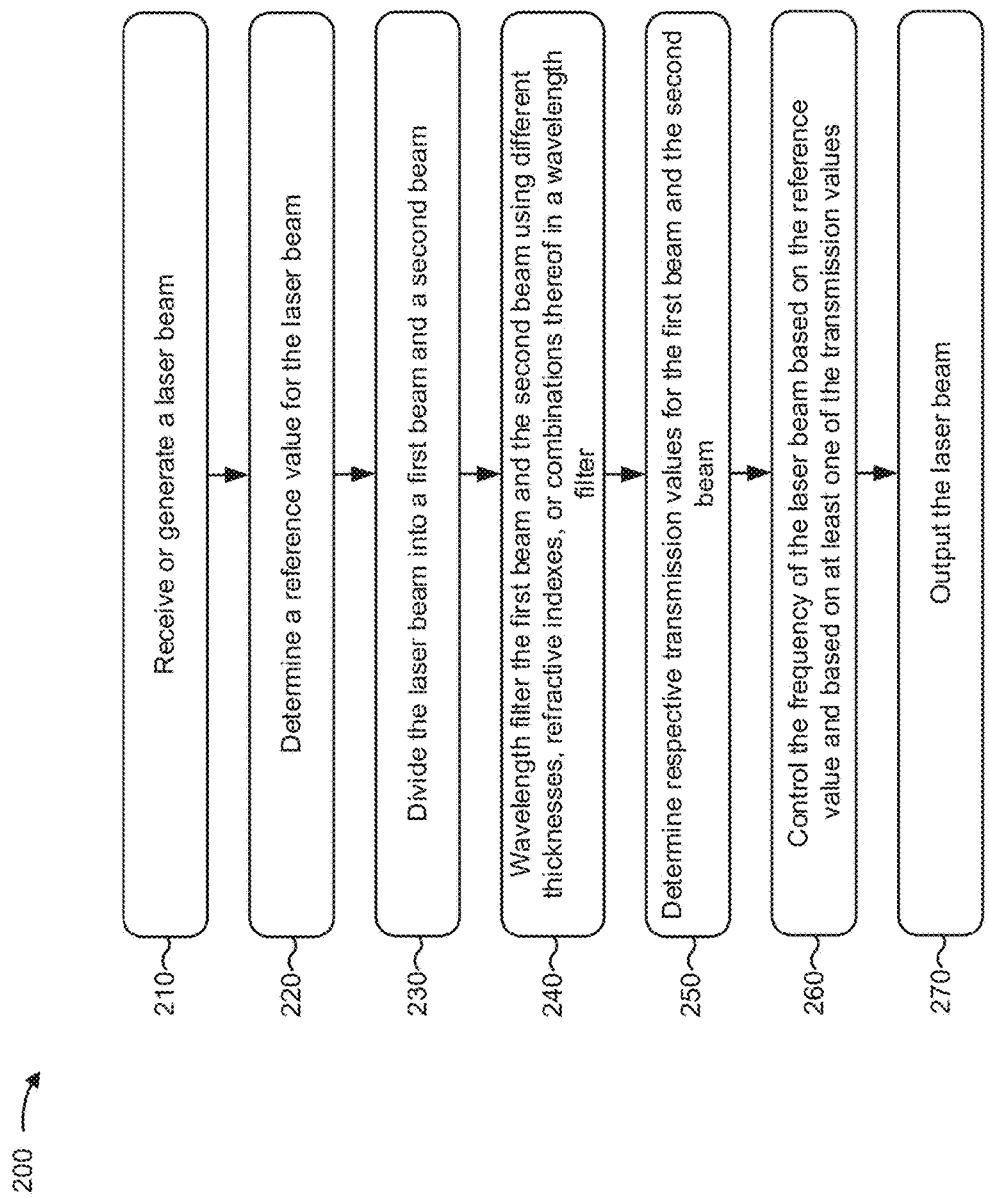
FIG. 2 is a flow chart of an example process for wavelength locking a laser emitter.

FIG. 2 is a flow chart of an example process 200 for performing a wavelength locking process using multiple feedback curves. Process 200 may be performed by wavelength locker 100.

As shown in FIG. 2, process 200 may include receiving or generating a laser beam (block 210). For example, wavelength locker 100 (e.g., laser emitter 102) may generate a laser beam. In some implementations, the laser beam may have a particular polarization state, or may include laser light in two orthogonal polarizations. In some implementations, the laser beam may be composed of unpolarized laser light.

In some implementations, wavelength locker 100 may receive the laser beam from another device, such as a laser emitter not included in wavelength locker 100, an optical fiber connected with wavelength locker 100, or the like. In some implementations, laser emitter 102 of wavelength locker 100 may generate the laser beam. For example, laser emitter 102 (e.g., a tunable laser emitter) may generate the laser beam at a particular wavelength based on a target wavelength and based on a feedback signal from controller 164 of wavelength locker 100.

As further shown in FIG. 2, process 200 may include determining a reference value for the laser beam (block 220). For example, wavelength locker 100 may determine a reference value for the laser beam. Wavelength locker 100 may determine the reference value based on a current generated by reference photodetector 114. For example, as described in connection with FIGS. 1A-1D, reference photodetector 114 may receive a part of the laser beam and may generate a current based on an optical power of the part of the laser beam. In some implementations, the reference value may be equal to an amperage of the current, may be equal to an amperage of the current scaled based on an optical power of the portion of the laser beam, or the like.

As further shown in FIG. 2, process 200 may include dividing the laser beam into a first beam and a second beam (block 230). For example, wavelength locker 100 may divide the laser beam into a first beam (e.g., laser beam 128 in FIG. 1A, laser beam 140 in FIG. 1B, or laser beam 160 in FIG. 1C) and a second beam (e.g., laser beam 130 in FIG. 1A, laser beam 142 in FIG. 1B, or laser beam 162 in FIG. 1C). In some implementations, wavelength locker 100 may divide the laser beam into the first beam and the second beam before the first beam and the second beam are wavelength filtered (e.g., as shown in FIGS. 1A and 1B). In other cases, wavelength locker 100 may wavelength filter the laser beam before dividing a filtered laser beam into the first beam and the second beam (e.g., as shown in FIG. 1C).

In some implementations, when the first beam and the second beam are divided before wavelength filtering, the first beam and the second beam may have similar optical powers, which simplifies determination of an observed wavelength. For example, the first beam, the second beam, and the part of the laser beam used to determine the reference value may be associated with substantially the same optical power (e.g., based on reflective properties of wedge splitter 112 or beam splitter 108-2).

As further shown in FIG. 2, process 200 may include wavelength filtering the first beam and the second beam using different thicknesses, refractive indexes or combinations thereof in a wavelength filter (block 240). For example, wavelength locker 100 may wavelength filter the first beam and the second beam at different frequency peaks, or having a frequency peak offset between feedback curves of the first and second beams because of the optical path difference between the first beam and the second beam in a wavelength filter (e.g., etalon 116, patterned etalon 134, or birefringent etalon 146). In some implementations, the peak offset between the feedback curves may be approximately 15 percent to 35 percent of a period of the feedback curves.

In some implementations, as shown in FIG. 1A, wavelength locker 100 creates an optical path difference between the first beam and the second beam based on an angular displacement between the first beam and the second beam as the first beam and the second beam are transmitted through etalon 116. In some implementations, as shown in FIG. 1B, wavelength locker 100 creates an optical path difference between the first beam and the second beam based on passing one of the first beam or the second beam through an etching or coating on patterned etalon 134 while the other is not passed through the etching or coating. In some implementations, as shown in FIG. 1C, wavelength locker 100 creates an optical path difference between the first beam and the second beam based on refractive indexes of waveplate 148 with regard to a polarization state of the first beam and a polarization state of the second beam. The optical path difference in the etalon 116/134/146 translates into a frequency peak offset in the frequency filtering experienced by the first and second beams in etalon 116/134/146.

Wavelength locker 100 creates an optical path difference in the etalon between optical paths traversed by the first beam and the second beam to cause a frequency peak offset in the feedback curves describing respective feedback signals for the first beam and the second beam. For an example of a single feedback curve describing a transmission rate for a range of input beam frequencies, see FIG. 3A. For an example of offset feedback curves corresponding to a first beam and a second beam that have different optical path lengths in etalon 116, patterned etalon 134, or birefringent etalon 146, see FIG. 3B.

The output energy value of a laser beam (e.g., the first beam or the second beam) that is wavelength filtered by an etalon (e.g., etalon 116, patterned etalon 134, or birefringent etalon 146) along a particular optical path can be approximated based on equation 1, shown below:

$$T(f) = \frac{1}{1 + \frac{4 \cdot R}{(1-R)^2} \cdot \sin^2\left(\frac{2\pi}{c} \cdot f \cdot l\right)},$$

where $l(f) = d \cdot n \cdot \cos(\arcsin(\sin(\theta_{in})/n))$.

In equation 1, T(f) identifies a ratio of input optical power to output optical power, $\theta_{in}$ identifies an incident angle of the laser beam with regard to the etalon (where 0 describes a laser beam that enters the etalon normal to the surface of the etalon), f identifies a frequency of the laser beam, d identifies a thickness of the etalon, c identifies the speed of light in a vacuum, R identifies a reflectance of the surfaces of the etalon, and n identifies a refractive index of the etalon at the frequency of the laser beam. In equation 1, l identifies an effective cavity length of etalon 116/134/146 with regard to the laser beam, and is derived based on the etalon thickness d, the refractive index n, and the incident angle of the laser beam $\theta_{in}$.

For a given etalon configuration and on a particular optical path, at some frequency values, laser beams will be passed at substantially full power. These frequency values are referred to as peak frequencies, and the separation between two peak frequencies is referred to as a peak offset. A set of peak frequencies $f_{peak}$ for a given configuration of etalon and laser beam can be determined based on equation 2, shown below:

$$f_{peak} = \frac{k \cdot c}{2 \cdot l} = \frac{k \cdot c}{2 \cdot d \cdot n} \cdot \frac{1}{\cos(\arcsin(\sin(\theta_{in})/n))}$$

In equation 2, k includes integer values equal to or greater than 1, and a k value of 3, for example, describes the third order peak frequency for the given configuration of etalon. The separation between values of $f_{peak}$ (e.g., the peak offset) can be increased or decreased by varying any one or more of the relative angle of incidence $\theta_{in}$ between a beam and the etalon (as in FIG. 1A), the thickness of the etalon d experienced by a beam (as in FIG. 1B), or the refractive index n experienced by a beam (as in FIG. 1C). By adjusting peak offset for a given configuration of etalon 116/134/146, wavelength locker 100 can selectively use the feedback curve for the first beam or for the second beam to control the wavelength of the laser beam generated by laser emitter 102.

Wavelength locker 100, as described in connection with FIG. 1C, uses waveplate 148 and substrate 150 of birefringent etalon 146 to create an optical path difference between the first beam and the second beam (e.g., the p-polarized portion of the laser beam and the s-polarized portion of the laser beam, respectively). The peak frequencies corresponding to p-polarized light and s-polarized light can be determined based on equations 3 and 4, shown below:

$$f_{peak\_p} = \frac{k \cdot c}{2 \cdot (d_s \cdot n_s \cdot \cos(\arcsin(\sin(\theta_{in})/n_s)) + d_w \cdot n_e \cdot \cos(\arcsin(\sin(\theta_{in})/n_e)))}, \text{ and}$$

$$f_{peak\_s} = \frac{k \cdot c}{2 \cdot (d_s \cdot n_s \cdot \cos(\arcsin(\sin(\theta_{in})/n_s)) + d_w \cdot n_o \cdot \cos(\arcsin(\sin(\theta_{in})/n_o)))},$$

where $f_{peak\_p}$ identifies peak frequencies for p-polarized light, $f_{peak\_s}$ identifies peak frequencies for s-polarized light, $d_s$ identifies a thickness of substrate 150, $n_s$ identifies a refractive index of substrate 150, $d_w$ identifies a thickness of waveplate 148, $n_o$ identifies a refractive index with regard to p-polarized light, and $n_e$ identifies a refractive index with regard to s-polarized light. k and c are described in connection with equation 2. In this way, wavelength locker 100, as described in connection with FIG. 1C, causes a phase shift between feedback curves associated with laser beams 160 and 162, which permits wavelength locker 100 to selectively use the feedback signal for laser beam 160 or for laser beam 162 to control the wavelength of the laser beam generated by laser emitter 102.

As further shown in FIG. 2, process 200 may include determining respective transmission values for the first beam and the second beam (block 250). For example, after filtering the first beam and the second beam, wavelength locker 100 may determine respective transmission values for the first beam and the second beam. Wavelength locker 100 may determine the respective transmission values based on currents generated by transmission photodetectors 118-1 and 118-2. For example, a transmission value for transmission photodetector 118-1 or 118-2 may be determined based on an amperage of the corresponding current, an amperage of the corresponding current scaled based on an input optical power of the corresponding laser beam, or the like. Transmission photodetectors 118-1 and 118-2 may generate the respective currents based on optical powers of the first beam and the second beam, as described in more detail elsewhere herein.

As further shown in FIG. 2, process 200 may include controlling the frequency of the laser beam based on the reference value and based on at least one of the transmission values (block 260). For example, wavelength locker 100 may control the frequency of the laser beam based on the reference value and at least one of the transmission values corresponding to the first beam and the second beam. Laser emitter 102 may include a tunable laser diode with a temperature component (capable of regulating a temperature of the tunable laser diode), an adjustable cavity, a current-modulated laser component, or the like, that can modify the frequency of the laser beam based on a feedback signal.

In some implementations, wavelength locker 100 may control the frequency of the laser beam by generating a feedback signal based on a difference between an observed wavelength and a target wavelength (e.g., a reference wavelength). Wavelength locker 100 determines the observed wavelength based on a ratio of a transmission value and a reference value. For example, wavelength locker 100 selects one of two or more feedback curves based on the reference wavelength (e.g., based on steepness of the feedback curves at the target wavelength, and uses a transmission value corresponding to the selected feedback curve to determine the observed wavelength (e.g., based on a ratio of the transmission value to the reference value). Based on a difference between the observed wavelength and the target wavelength, wavelength locker 100 causes the emission wavelength of the beam emitted by laser emitter 102 to be adjusted to match the target wavelength.

Notably, wavelength locker 100 can be used with varying wavelengths of laser beam without reconfiguration of a wavelength filter of wavelength locker 100. For example, based on wavelength locker 100 using feedback curves with a particular peak offset, wavelength locker 100 may be capable of wavelength locking laser beams of varying wavelength. To update the target wavelength of the wavelength-locked beam, wavelength locker 100 may update the target wavelength stored by controller 164, and may perform the operations described above with regard to the updated target wavelength to wavelength lock the laser beam. The particular peak offset may cause each wavelength, of a range of wavelengths that the tunable laser emitter 102 can emit, to be located on a steeply-sloped region of one or more of the feedback curves. In this way, wavelength locker 100 improves accuracy and/or precision of the wavelength locking process and enables reconfiguration of the tunable laser emitter 102 or wavelength locking to a different frequency grid without reconfiguring an etalon of wavelength locker 100.

As further shown in FIG. 2, process 200 may include outputting the laser beam (block 270). For example, wavelength locker 100 may output the laser beam (e.g., a portion of the laser beam) to output component 110. The outputted laser beam may have an optical power that is approximately 80 percent, 90 percent, 95 percent, 97 percent, 99 percent, or the like, of the optical power of the laser beam when generated. For example, beam splitter 108 may transmit a large portion of the laser beam (e.g., 80 percent, 90 percent, 95 percent, 97 percent, 99 percent, or the like) and may reflect or direct a remainder of the laser beam to perform the wavelength locking process. By transmitting a large portion of the laser beam, beam splitter 108 reduces power usage by laser emitter 102.

In this way, wavelength locker 100 wavelength locks a laser beam based on multiple feedback curves that, in combination, include steep-sloped regions covering a range of wavelengths that may be emitted by laser emitter 102, which improves versatility of wavelength locker 100 and accuracy and precision of the wavelength locking process.

Although FIG. 2 shows example blocks of process 200, in some implementations, process 200 may include additional blocks, fewer blocks, different blocks, or differently arranged blocks than those depicted in FIG. 2. Additionally, or alternatively, two or more of the blocks of process 200 may be performed in parallel.

FIG. 3A is a graph 305 of an example relationship between transmission values and reference values describing a laser beam and wavelength of the laser beam, as generated by a wavelength locker. The wavelength locker associated with FIG. 3A uses one feedback curve to wavelength lock a laser beam, as compared to wavelength locker 100, which uses two or more feedback curves with a peak offset that causes each wavelength, of a range of wavelengths, to be associated with a steeply-sloped portion of one of the two or more feedback curves. Therefore, a single feedback curve is shown in FIG. 3A. The etalon described with regard to FIG. 3A includes the components described in connection with etalon 116 in FIG. 1A.

An etalon wavelength filters laser beams to substantially full power, or less than full power, based on frequency of the laser beams and optical paths which the laser beams traverse in the etalon. The optical power of a filtered laser beam can be approximated using an Airy function or a wrapped Lorentzian distribution, based on the input frequency and optical power of the filtered laser beam and the material and geometric properties of the optical path taken through the etalon, such as the angle of incidence of the filtered laser beam to the etalon, the thickness of the etalon, and the etalon's refractive index. For example, as shown by reference number 310, laser beams that are associated with particular frequencies (e.g., resonant frequencies of the etalon) are passed at substantially full power on a given optical path, shown here as maxima of the Airy function. The spacing between the particular frequencies is referred to as a free spectral range (FSR), or as a period of the Airy function. The Airy function for a particular etalon is shown in FIG. 3A, and is referred to as a feedback curve. Each wavelength filter may have a different feedback curve for each different optical path through the wavelength filter. Each feedback curve characterizes the wavelength filtering experienced by a beam of light passing through the wavelength filter along the associated optical path.

In the example feedback curve charted in FIG. 3A, laser beams with frequencies of roughly 193,030 GHz, 193,130 GHz, and so on, are passed at substantially full power. Further, laser beams with frequencies of approximately 193,080 GHz, 193,180 GHz, and so on, are passed at a minimum optical power of approximately 38% of the maximum. Based on a ratio of an output energy of a laser beam (e.g., a transmission value) and an input optical power of a laser beam (e.g., a reference value), the wavelength locker may determine an observed frequency of the laser beam. For example, the wavelength locker may store information identifying a relationship between output energies and frequencies (i.e., the feedback curve), and may use the stored information to determine the observed frequency. Based on a difference between the observed frequency and a reference frequency (e.g., a target frequency), the wavelength locker may generate a feedback signal, as described in more detail elsewhere herein.

The etalon may be configured to pass laser beams of a target frequency on a given optical path at a particular optical power, such as the optical power corresponding to the ratio shown by reference number 315. The region of the feedback curve shown by reference number 315 may be used because fluctuations in the ratio at reference number 315 more precisely identify the frequency of the laser beam than fluctuations at, for example, the region of the feedback curve shown by reference number 320 (shown as the "blind area"). For example, at reference number 320, a fluctuation from a ratio of 0.38 to a ratio of 0.40 encompasses approximately 20 GHz of frequency, whereas a similar fluctuation at reference number 315 encompasses approximately 2 GHz of frequency. Other blind areas occur at resonant frequencies of the etalon, as shown by reference number 325.

In an application where a set of target frequencies are likely to be evenly spaced, the etalon may be configured so that the target frequencies are associated with steeper slopes in the feedback curve, such as at reference number 315. However, when a set of target frequencies is not evenly spaced, such as when the wavelength locked laser beam may be tuned to any arbitrary value, some target frequencies of the set may be associated with shallow slopes in the feedback curve, such as at the regions identified by reference numbers 320 and 325. Therefore, estimates of observed frequencies corresponding to the target frequencies may be inaccurate or imprecise.

Figure 3B:
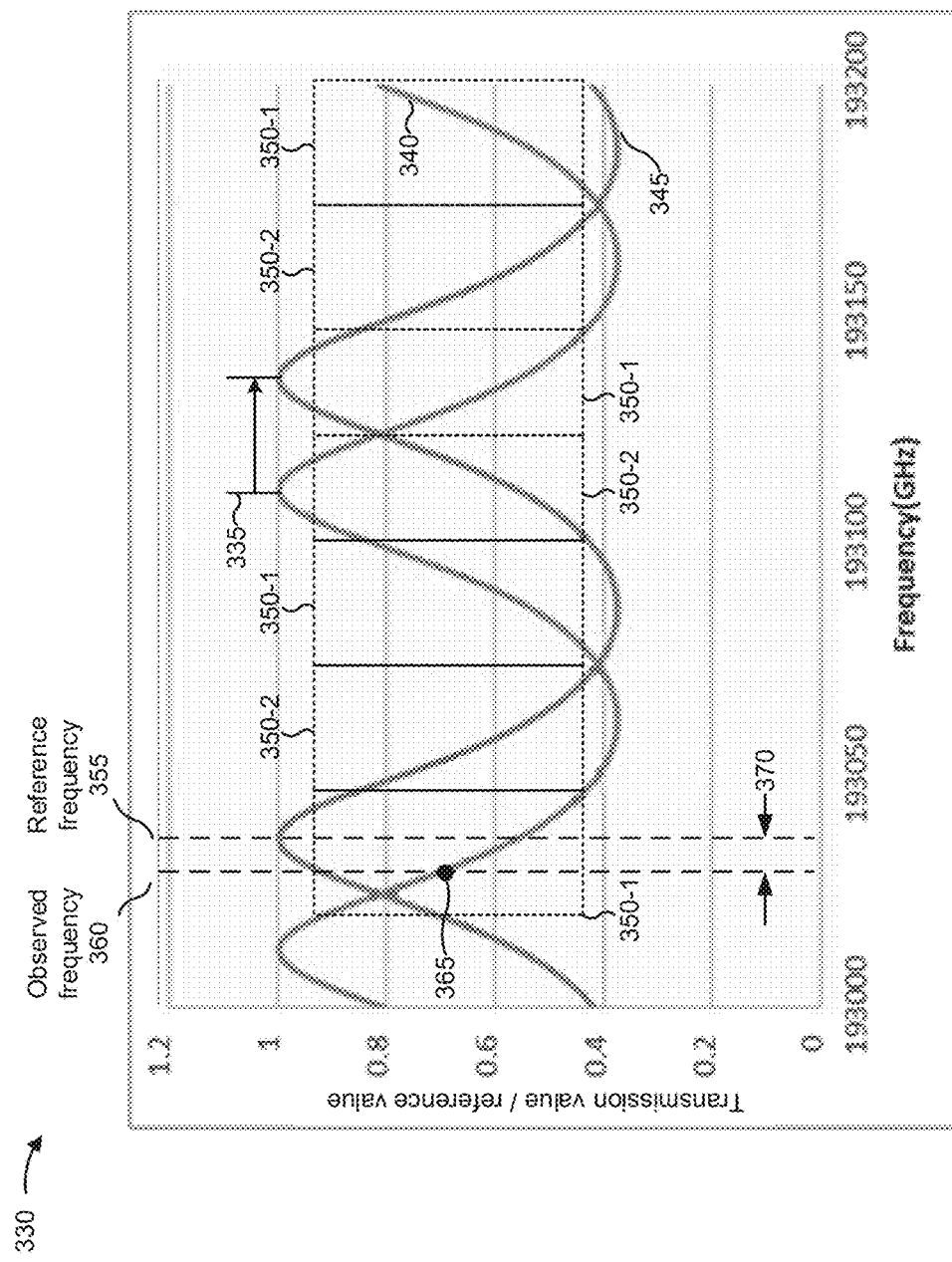
FIG. 3B is a graph of an example relationship between transmission values and reference values describing a laser beam and wavelength of the laser beam, as generated by a wavelength locker using multiple feedback curves.

FIG. 3B is a graph 330 of an example relationship between transmission values and reference values describing a laser beam and frequency of the laser beam, as generated by wavelength locker 100. As shown in FIG. 3B, and by reference number 335, a first feedback curve 340, corresponding to a first transmission value, may be shifted from a second feedback curve 345 corresponding to a second transmission value. The shift between the two feedback curves is referred to herein as a peak offset. Here, the peak offset is approximately 13 GHz, corresponding to an approximate phase shift of 25% between feedback curve 340 and feedback curve 345.

As shown by reference numbers 350-1 and 350-2, a steep-sloped region of at least one of the two feedback curves covers each frequency to which laser emitter 102 can be tuned. Steep-sloped regions are shown by tightly-dashed rectangles. Here, steep-sloped regions corresponding to feedback curve 340 are shown by reference number 350-1 and steep-sloped regions corresponding to feedback curve 345 are shown by reference number 350-2. One rectangle, corresponding to one steep-sloped region for feedback curve 345, is omitted for clarity at the left side of graph 330.

Assume that wavelength locker 100 is configured to wavelength lock a laser beam to a reference frequency of 193,035 GHz, as shown by reference number 355. As shown, the reference frequency is located in the steeply-sloped region of feedback curve 340. Therefore, controller 164 of wavelength locker 100 may select feedback curve 340 to determine observed frequency 360 (i.e., the emission frequency of the laser beam). Controller 164 may receive a reference current from reference photodetector 114, and may receive a transmission current from transmission photodetector 118 (e.g., transmission photodetector 118 that is associated with feedback curve 340, rather than a transmission photodetector 118 that is associated with feedback curve 345).

Assume that controller 164 determines that a ratio of the transmission current to the reference current is equal to approximately 0.69, as shown by reference number 365. Assume further that controller 164 stores information identifying the relationship between ratio 365 and observed frequency 360, which is the emission frequency of the laser beam (i.e., information identifying feedback curve 340). Based on the stored information, controller 164 may determine that observed frequency 360 is approximately equal to 193,030 GHz.

Based on the difference 370 between reference frequency 355 and observed frequency 360 (e.g., approximately 5 GHz), controller 164 may generate a feedback signal. The feedback signal may cause laser emitter 102 that generates the laser beam to modify the emission frequency of the laser beam. For example, the feedback signal may cause laser emitter 102 to be provided a different drive current thereby adjusting the emission frequency of the laser beam.

In this way, wavelength locker 100 uses multiple feedback curves, corresponding to multiple optical paths, to control frequencies, which improves accuracy and precision of wavelength locking for laser beams that are associated with frequencies near a blind area of a feedback curve. Furthermore, by using the multiple feedback curves, wavelength locker 100 improves versatility of the wavelength locking process and can more accurately and/or more precisely wavelength lock a wider variety of frequencies than a wavelength locker that uses one feedback curve.

As indicated above, FIGS. 3A and 3B are provided merely as examples. Other examples are possible and may differ from what was described with regard to FIGS. 3A and 3B.

The foregoing disclosure provides illustration and description, but is not intended to be exhaustive or to limit the implementations to the precise form disclosed. Modifications and variations are possible in light of the above disclosure or may be acquired from practice of the implementations.

While implementations described herein are described with regard to two transmission photodetectors and two feedback curves, implementations described herein are not limited to two transmission photodetectors or two feedback curves. Rather, any arbitrary number of transmission photodetectors (e.g., 3, 4, 5, etc.) corresponding to an arbitrary number of feedback curves may be used.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
   a laser emitter to generate a laser beam to be wavelength locked to a target frequency based on an emission frequency to be measured by the device;
   a first photodetector to generate a first current based on a first optical power of the laser beam,
      the laser beam to be wavelength locked based on the first current;
   a beam splitter to split a portion of the laser beam into a first beam and a second beam;
   a patterned etalon to filter the first beam and the second beam,
      the patterned etalon to have different optical path lengths for the first beam and the second beam,
      the patterned etalon including a surface, located only on a single side of the patterned etalon, in an optical path of the first beam and not the second beam,
      the first beam to be filtered by the patterned etalon and the surface and the second beam to be filtered by the patterned etalon and not filtered by the surface, and
      the patterned etalon to filter the first beam and the second beam to a second optical power and a third optical power, respectively, based on the different optical path lengths; and
   second and third photodetectors to generate respective second currents,
      a selected current, of the respective second currents, to be used to wavelength lock the laser beam.

2. The device of claim 1, where
   the beam splitter is further to split the portion of the laser beam into a third beam and a fourth beam, and
   the third beam is received by the first photodetector without being filtered by the patterned etalon.

3. The device of claim 1, where
   the second and third photodetectors are further to generate the respective second currents based on the second optical power and the third optical power, respectively.

4. The device of claim 1, where the patterned etalon includes a patterned surface in an optical path of the first beam or the second beam.

5. The device of claim 4, where the beam splitter comprises a walkoff splitter to cause a particular spatial separation, between the first beam and the second beam, to cause one of the first beam or the second beam to be transmitted through the patterned surface.

6. The device of claim 1, where
   the surface is a patterned surface, an etched surface, a coated surface, or a wafer attached to patterned etalon.

7. The device of claim 1, where
   the different optical path lengths are configured to cause a frequency offset between a first curve corresponding to the first beam and a second curve corresponding to the second beam, and
   the device further comprises:
      a controller to select the selected current based on a location on the first curve and the second curve of a point corresponding to the target frequency.

8. The device of claim 1, further comprising:
   a controller to generate a feedback signal to cause the laser emitter to modify the emission frequency based on a difference between the emission frequency and the target frequency.

9. A device, comprising:
   a first photodetector to generate a first current based on a first optical power of a laser beam;
   a beam splitter to split a portion of the laser beam into a first beam and a second beam;
   a patterned etalon to filter the first beam and the second beam,
      the patterned etalon to have different optical path lengths for the first beam and the second beam, and
      the patterned etalon including a surface, located only on a single side of the patterned etalon, in an optical path of the first beam and not the second beam,
      the first beam to be filtered by the patterned etalon and the surface and the second beam to be filtered by the patterned etalon and not filtered by the surface, and
      the patterned etalon to filter the first beam and the second beam to a second optical power and a third optical power, respectively, based on the different optical path lengths in the patterned etalon; and
   second and third photodetectors to generate respective second currents,
      the first current and a selected current, of the respective second currents, to be used to wavelength lock the laser beam.

10. The device of claim 9, further comprising:
    a controller to generate a feedback signal based on the first current and a selected one of the respective second currents.

11. The device of claim 10, where the controller is further configured to select the selected one of the respective second currents based on a target frequency for the laser beam.

12. The device of claim 9, where the patterned etalon includes a patterned surface in an optical path of the first beam or the second beam.

13. The device of claim 12, where the beam splitter comprises a walkoff splitter to cause a particular spatial separation, between the first beam and the second beam, to cause one of the first beam or the second beam to be transmitted through the patterned surface.

14. The device of claim 9, where
    the surface is a patterned surface, an etched surface, a coated surface, or a wafer attached to patterned etalon.

15. The device of claim 9, where the beam splitter is further to:
    form the first beam and the second beam after the portion of the laser beam is filtered; and
    form the first beam and the second beam based on a polarization state of the first beam and a polarization state of the second beam.

16. The device of claim 9, where
    the beam splitter is further to split the portion of the laser beam into a third beam and a fourth beam, and the third beam is received by the first photodetector without being filtered by the patterned etalon.

17. The device of claim 9, where the different optical path lengths are configured to cause a frequency offset between a first curve corresponding to the first beam and a second curve corresponding to the second beam.

18. A method, comprising:
receiving or generating a laser beam to be wavelength locked to a target frequency based on an emission frequency at which the laser beam is generated;
splitting, by a beam splitter, the laser beam into a first beam and a second beam;
wavelength filtering, by a patterned etalon, the first beam and the second beam using different optical path lengths in a wavelength filter,
the different optical path lengths causing the wavelength filter to filter the first beam differently than the second beam,
the patterned etalon including a surface, located only on a single side of the patterned etalon, in an optical path of the first beam and not the second beam,
the first beam to be filtered by the patterned etalon and the surface and the second beam to be filtered by the patterned etalon and not filtered by the surface;
selecting, as a selected transmission value, a transmission value corresponding to the first beam or a transmission value corresponding to the second beam;
determining the emission frequency based on the selected transmission value; and
controlling the emission frequency.

19. The method of claim 18, further comprising:
determining a reference value based on an optical power of the laser beam; and
determining the transmission value corresponding to the first beam and the transmission value corresponding to the second beam,
where determining the emission frequency includes:
determining the emission frequency based on the selected transmission value and the reference value, and
where controlling the emission frequency includes:
controlling the emission frequency based on a difference between the emission frequency and the target frequency.

20. The method of claim 18, where wavelength filtering the first beam and the second beam comprises:
configuring the different optical path lengths to cause a frequency offset between a first curve corresponding to the first beam and a second curve corresponding to the second beam; and
selecting the transmission value comprises:
determining whether the target frequency is associated with a steeper slope on the first curve or on the second curve; and
selecting the transmission value based on whether the target frequency is associated with the steeper slope on the first curve or the second curve,
the transmission value corresponding to the first beam being selected as the selected transmission value when the target frequency is associated with a steeper slope on the first curve, or
the transmission value corresponding to the second beam being selected as the selected transmission value when the target frequency is associated with a steeper slope on the second curve.

* * * * *